United States Patent
Nakai et al.

(10) Patent No.: US 7,333,363 B2
(45) Date of Patent: Feb. 19, 2008

(54) SEMICONDUCTOR STORAGE APPARATUS

(75) Inventors: Kiyoshi Nakai, Tokyo (JP); Kazuhiko Kajigaya, Tokyo (JP); Isamu Asano, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/409,088

(22) Filed: Apr. 24, 2006

(65) Prior Publication Data

US 2006/0239097 A1 Oct. 26, 2006

(30) Foreign Application Priority Data

Apr. 25, 2005 (JP) ............................. 2005-126457

(51) Int. Cl.
*G11C 14/00* (2006.01)
(52) U.S. Cl. .................. 365/185.08; 365/151
(58) Field of Classification Search .......... 365/185.08, 365/185.18, 185.25, 222, 154, 156, 151, 365/152
See application file for complete search history.

(56) References Cited

U.S. PATENT DOCUMENTS

| | | | |
|---|---|---|---|
| 6,775,184 B1 * | 8/2004 | Park et al. ............. | 365/185.08 |
| 6,894,918 B2 | 5/2005 | Sharma et al. | |
| 6,928,512 B2 | 8/2005 | Ayukawa et al. | |
| 6,952,366 B2 * | 10/2005 | Forbes .................. | 365/185.08 |
| 6,992,928 B2 * | 1/2006 | Inoue .................... | 365/185.08 |
| 7,099,189 B1 * | 8/2006 | Plants ................... | 365/185.08 |
| 2006/0211231 A1 * | 9/2006 | Asano et al. ............... | 438/593 |

FOREIGN PATENT DOCUMENTS

| | | |
|---|---|---|
| JP | 2003-6041 | 1/2003 |
| JP | 2003-91463 | 3/2003 |
| JP | 2004-39229 | 2/2004 |

* cited by examiner

*Primary Examiner*—Gene N. Auduong
(74) *Attorney, Agent, or Firm*—McGinn IP Law Group, PLLC

(57) ABSTRACT

Disclosed is a semiconductor storage apparatus in which two sorts of memories, that is, a volatile memory and a non-volatile memory, are mounted on one chip. Data of a DRAM memory array are saved in a corresponding area of a non-volatile memory before entry to a data retention mode or before power down and data is transferred from the area of the non-volatile memory to the DRAM memory array in exiting from the data retention mode or power up. Normal read/write access is made to the DRAM memory array, while data retention is in an area of the non-volatile memory.

20 Claims, 6 Drawing Sheets

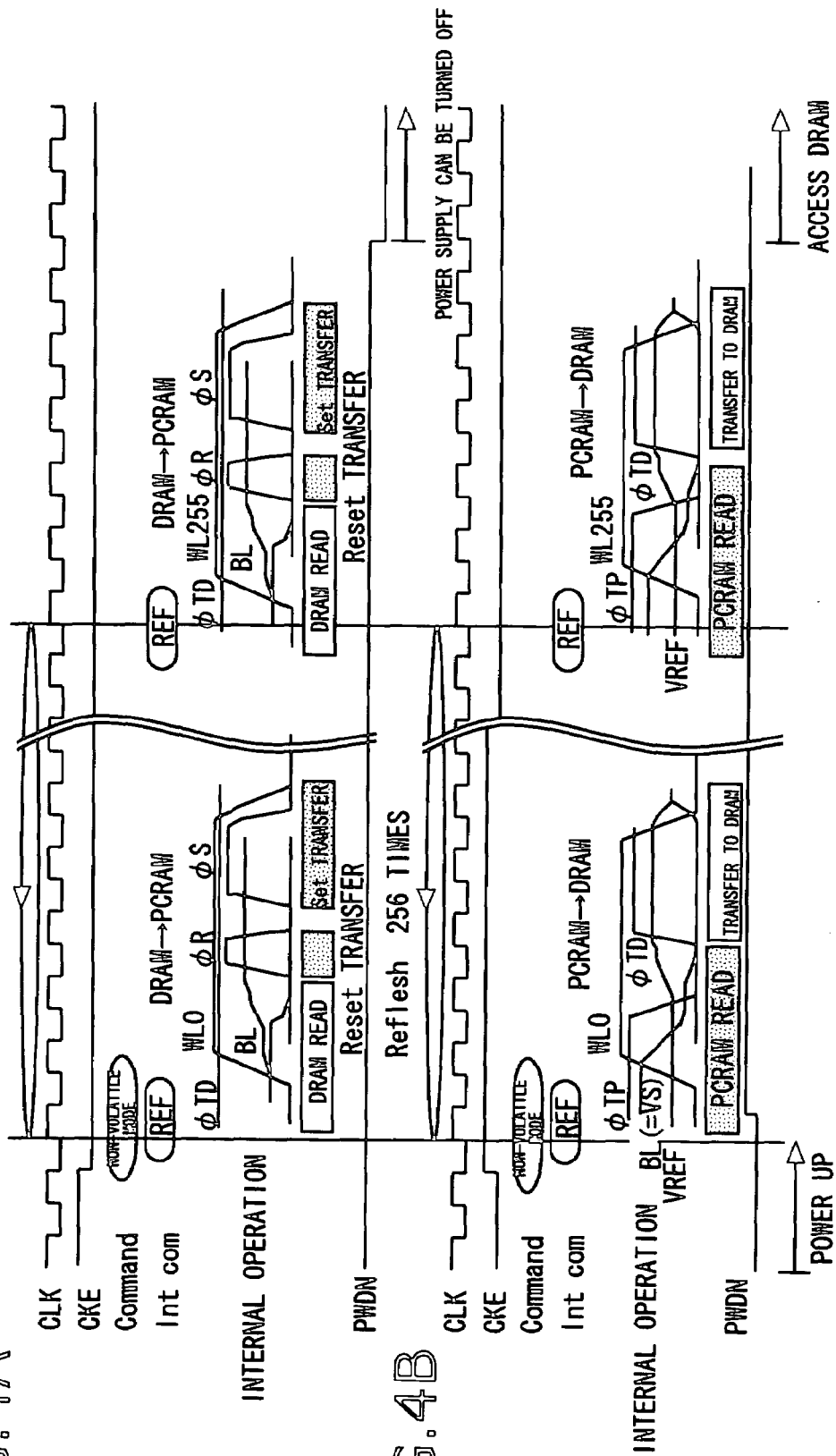

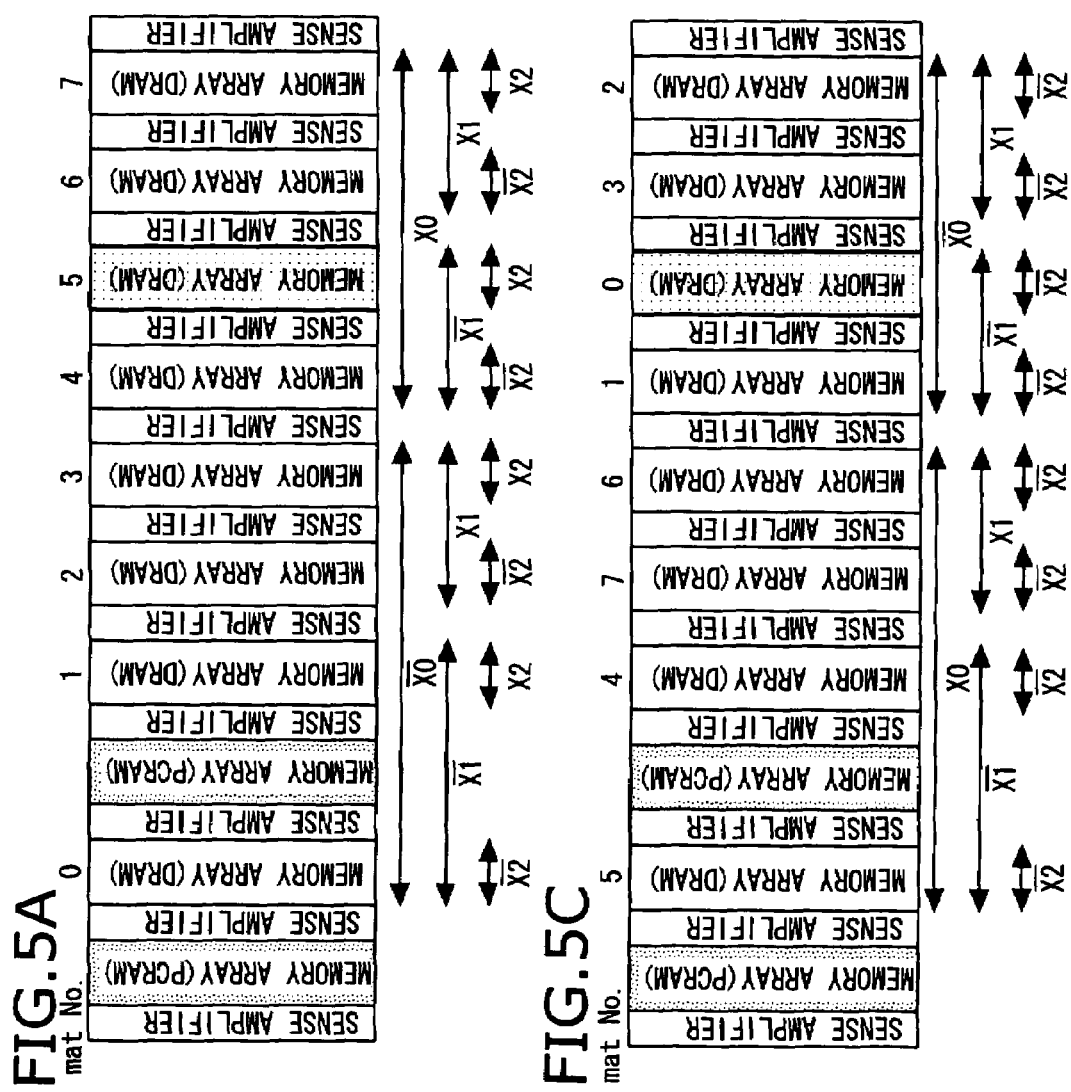

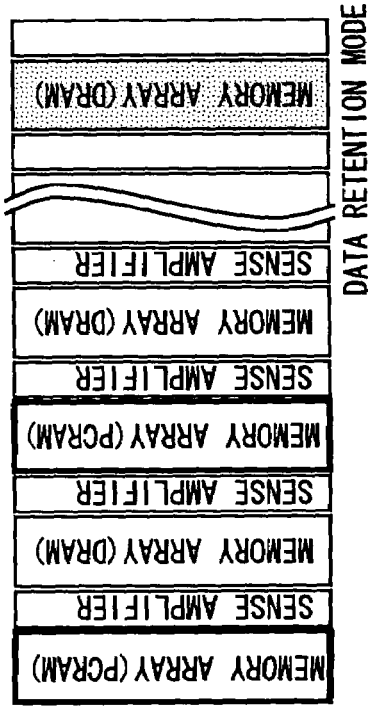
FIG.6A
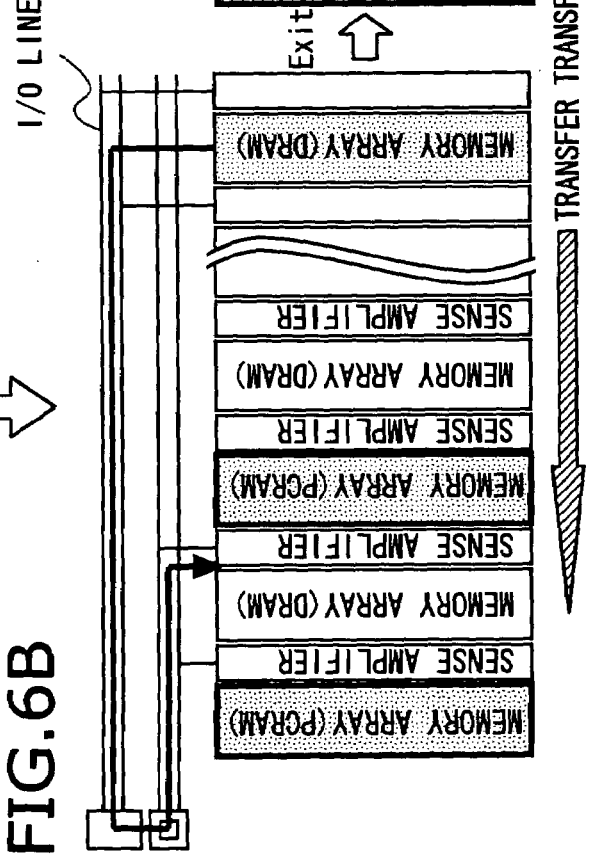
FIG.6B
FIG.6C

SEMICONDUCTOR STORAGE APPARATUS

FIELD OF THE INVENTION

This invention relates to a semiconductor storage apparatus and, more particularly, to a mixed memory composed of a non-volatile memory and a dynamic random access memory (DRAM) which is in need of refresh operations for data retention.

BACKGROUND OF THE INVENTION

A DRAM is capable of high-speed read (Read)/write (Write) operations. However, the DRAM is a volatile memory and hence is in need of refresh (Refresh) operations for data retention. Consequently, the DRAM suffers a problem that the data holding current is increased. The reduction of the data holding current in the DRAM during the standby time thereof is demanded.

A flash memory (Electrically Erasable and Programmable ROM or EEPROM) or a phase change memory, as a non-volatile memory, capable of high integration density, is not in need of power supply for data retention, however, suffers the problem that it is low in its write speed and in rewrite withstand characteristic.

In Patent Document 1, there is disclosed a memory in which a DRAM chip, an SRAM (static random access memory) chip, or a DRAM chip and a FLASH memory, are mounted in one seal package to increase the storage capacity and to decrease the data holding current. In Patent Document 2, there is disclosed a memory apparatus employing a volatile memory (SDRAM) and a non-volatile memory (FLASH memory), in which the non-volatile memory may be accessed from a host to provide for improved controllability from the host. In Patent Document 3, there is disclosed a configuration comprising a volatile first memory and a non-volatile memory cell (MRAM) connected to the first memory cell. In this configuration, data may be written in the first memory cell or the non-volatile memory cell, whilst data from the first memory cell or the non-volatile memory cell may be transferred to the non-volatile memory cell or the first memory cell.

[Patent Document 1]
 JP Patent Kokai Publication No. JP-P2003-6041A

[Patent Document 2]
 JP Patent Kokai Publication No. JP-P2003-91463A

[Patent Document 3]
 JP Patent Kokai Publication No. JP-P2004-39229A

SUMMARY OF THE DISCLOSURE

It is an object of the present invention to provide a semiconductor memory device, having two different types of memories, namely a volatile memory and a non-volatile memory, mounted on one chip, to take advantage of merits proper to the respective memories, and exhibiting the characteristics of a high operating speed and a low power consumption in combination.

The above and other objects are attained by the present invention configured substantially as follows:

A semiconductor storage apparatus in accordance with one aspect of the present invention comprises: a first memory array having a plurality of volatile memory cells; a second memory array having a plurality of non-volatile memory cells; and a sense amplifier provided between said first and second memory arrays; wherein data transfer from one of said first memory array and said second memory array to the other memory array is carried out through said sense amplifier.

Preferably, in the present invention, the volatile memory cells are dynamic memory cells in need of refresh for data retention. Preferably, in the present invention, the sense amplifier may be shared between the first and second memory arrays.

Preferably, in the present invention, the non-volatile memory cells may be phase change memory cells capable of assuming a set state with low resistance and a reset state with high resistance.

The semiconductor storage apparatus according to the present invention, may comprises means for transferring at least a portion of data of the first memory cell array to the second memory array, wherein after the end of transfer, the data may be held by the non-volatile memory cells of the second memory array.

Preferably, in the present invention, data transfer from the first memory array to the second memory array may preferably be made prior to entry to the data retention mode or power down.

The semiconductor storage apparatus according to the present invention, may comprises means for transferring data held by the non-volatile memory cells of the second memory array to the dynamic memory cells of the second memory array, wherein after exiting the data retention mode or power up, the data held by the non-volatile memory cells of the second memory array are written bake to the dynamic memory cells of the first memory array and access from outside is made to the first memory array.

Preferably, in the present invention, access may directly be made to the second memory array from outside. Preferably, in the present invention, during transfer of data from the first memory array to the second memory array, read access to the second memory array may be allowed, while write access may be inhibited.

Preferably, in the present invention, data may be transferred from the first memory array to the second memory array through the sense amplifier on the word line basis.

Preferably, in the present invention, data of a DRAM memory array are saved in a corresponding area of a non-volatile memory before entry to a data retention mode or before power down, the data is transferred from the area of the non-volatile memory to the DRAM memory array at the time of exiting from the data retention mode or power up, and date read/write access is made to the DRAM memory array, while data is held in an area of the non-volatile memory.

Preferably, in the present invention, a plurality of sense amplifiers, each connected to one of a plurality of bit line pairs of said first memory array, are alternately arranged on both sides of said first memory array, every bit line pair, to form first and second groups of sense amplifiers; and two of said second memory arrays are arranged on both sides of said first memory array with said first and second groups of said sense amplifiers in-between.

The meritorious effects of the present invention are summarized as follows.

According to the present invention, the high speed proper to the volatile memory may be achieved during the normal operation, while data is held by the non-volatile memory, during the data retention time, such as during standby time, thus achieving low current consumption.

Still other features and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIGS. 4A and 4B are schematic views for is a diagram for illustrating the operation of the embodiment of the present invention.

FIGS. 5A, 5B, 5C and 5D are diagrams for illustrating the operation of another embodiment of the present invention.

FIGS. 6A, 6B and 6C are diagrams for illustrating the operation of yet another embodiment of the present invention.

PREFERRED EMBODIMENTS OF THE INVENTION

Figure 1:
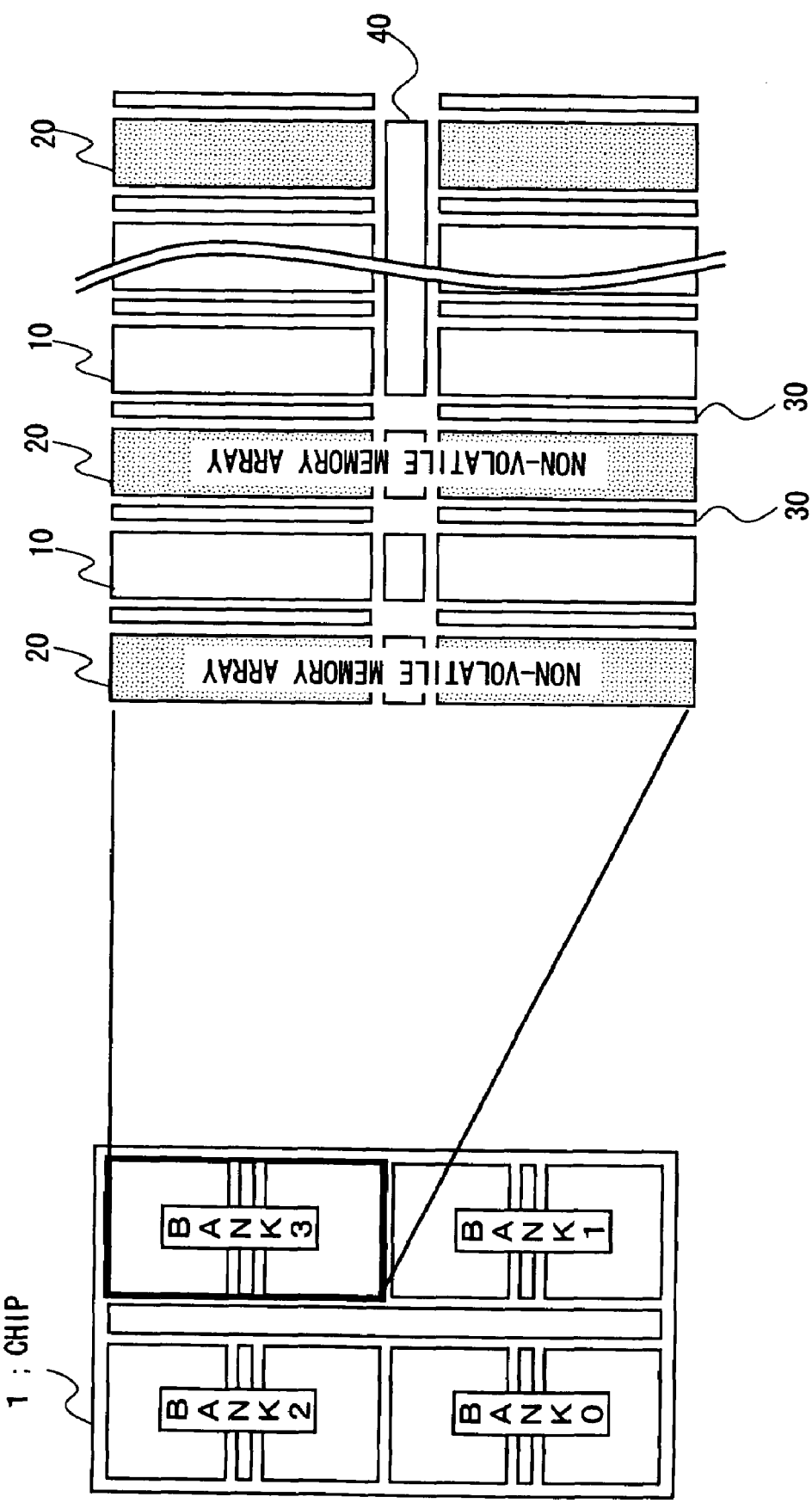
FIG. 1 is a diagram for illustrating the configuration of an embodiment of the present invention.

Reference is made to the drawings for illustrating the present invention in detail. FIG. 1 shows, in a block diagram, the configuration of a DRAM- and non-volatile memory mixed type chip according to an embodiment of the present invention. A chip 1 is made up of four banks (BANK0 to BANK3), each of which includes a plural number of sets each composed of a DRAM memory array 10, a non-volatile memory array 20, and a sense amplifier 30 arranged in-between. There are provided two rows of the plural sets of the memory arrays and the sense amplifiers. This configuration is given only for the sake of explanation and, of course, is not intended for limiting the invention. In FIG. 1, the reference numeral 40 denotes a word driver or a sub-word driver.

In a well-known manner, the refresh operation for a DRAM is carried out as follows: A word line, selected by a refresh address, is pulled up to a high potential, and data held by a memory cell, read on a bit line, connected to the memory cell as selected by the word line, is amplified by a sense amplifier connected to the bit line. The resulting amplified signal is re-written from the bit line to the memory cell. The potential of the word line is then pulled down to complete re-writing the memory cell data.

In the present embodiment, the non-volatile memory array 20 is made up of a phase change memory (PCRAM), though not in a limiting sense.

In a preferred embodiment of the present invention, data transfer from a DRAM memory array to a non-volatile memory array, also termed a non-volatile memory area, may be carried out by the transfer operation to the phase change memory (PCRAM) during the refresh operation which is executed by the sense amplifier, thereby avoiding complicating the control.

Figure 2C:
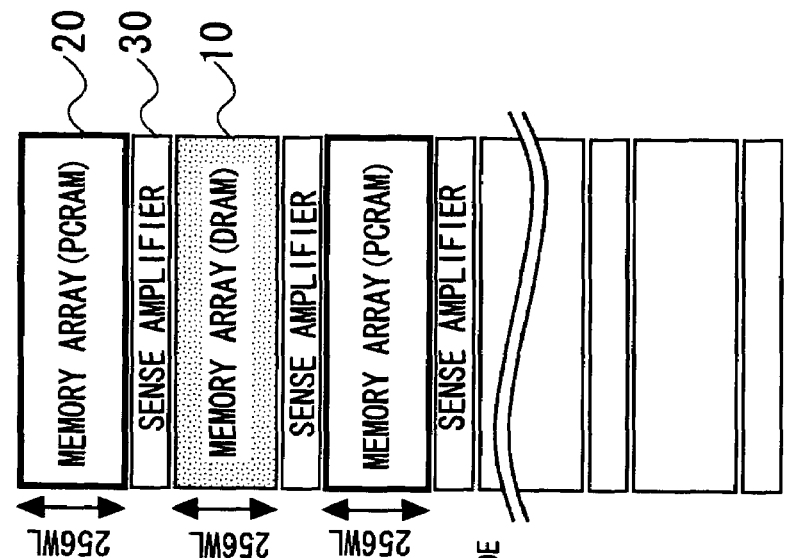
FIGS. 2A, 2B and 2C are diagrams for illustrating the operation of the embodiment of the present invention.

The operation of the first embodiment of the present invention will now be explained. FIG. 2 schematically shows the operation of the embodiment of the present invention. In FIG. 2, the number of word lines of each memory array (WL) is set to 256 (256 WL). This configuration is given only for the sake of explanation and, of course, is not intended for limiting the invention.

Figure 2B:
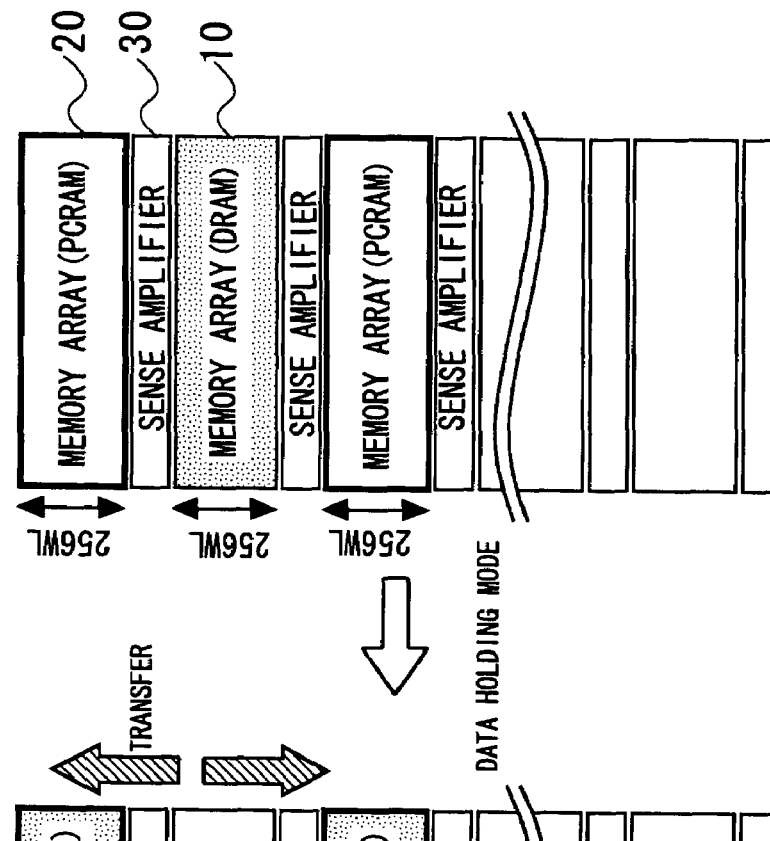

Referring to FIG. 2B, data of an area of the DRAM memory array is transferred to and held by the non-volatile memory array (PCRAM), prior to power down, that is, prior to entry to the data retention mode.

Figure 2A:
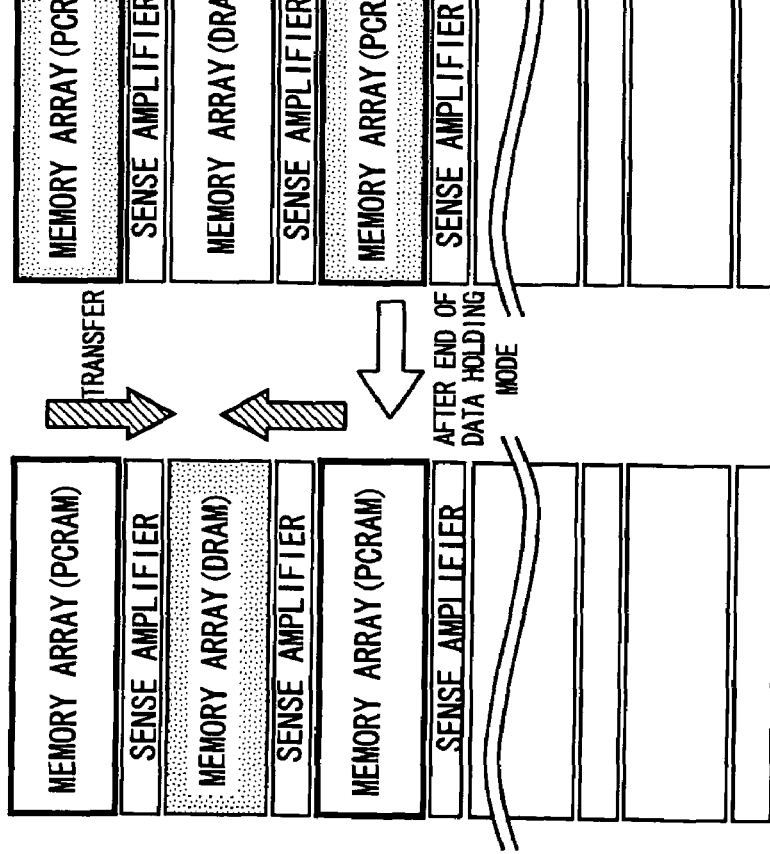

Referring to FIG. 2A, the data is transferred, after the end of the data retention mode, from the non-volatile memory array (PCRAM) to the DRAM memory array.

The storage capacity of the non-volatile memory array 20 is set, only by way of an example, to one-half the capacity of the memory array 10 which is located neighboring to the non-volatile memory array 20, with the sense amplifiers 30 in-between. It is noted that two of the non-volatile memory arrays 20 are arranged on both sides of the DRAM memory array 10, with the sense amplifier area in-between the non-volatile memory array and the DRAM memory array. It is because the sense amplifiers are alternately arranged in a staggered fashion on the left and right sides of the DRAM memory array 10 every bit line pair.

Figure 3:
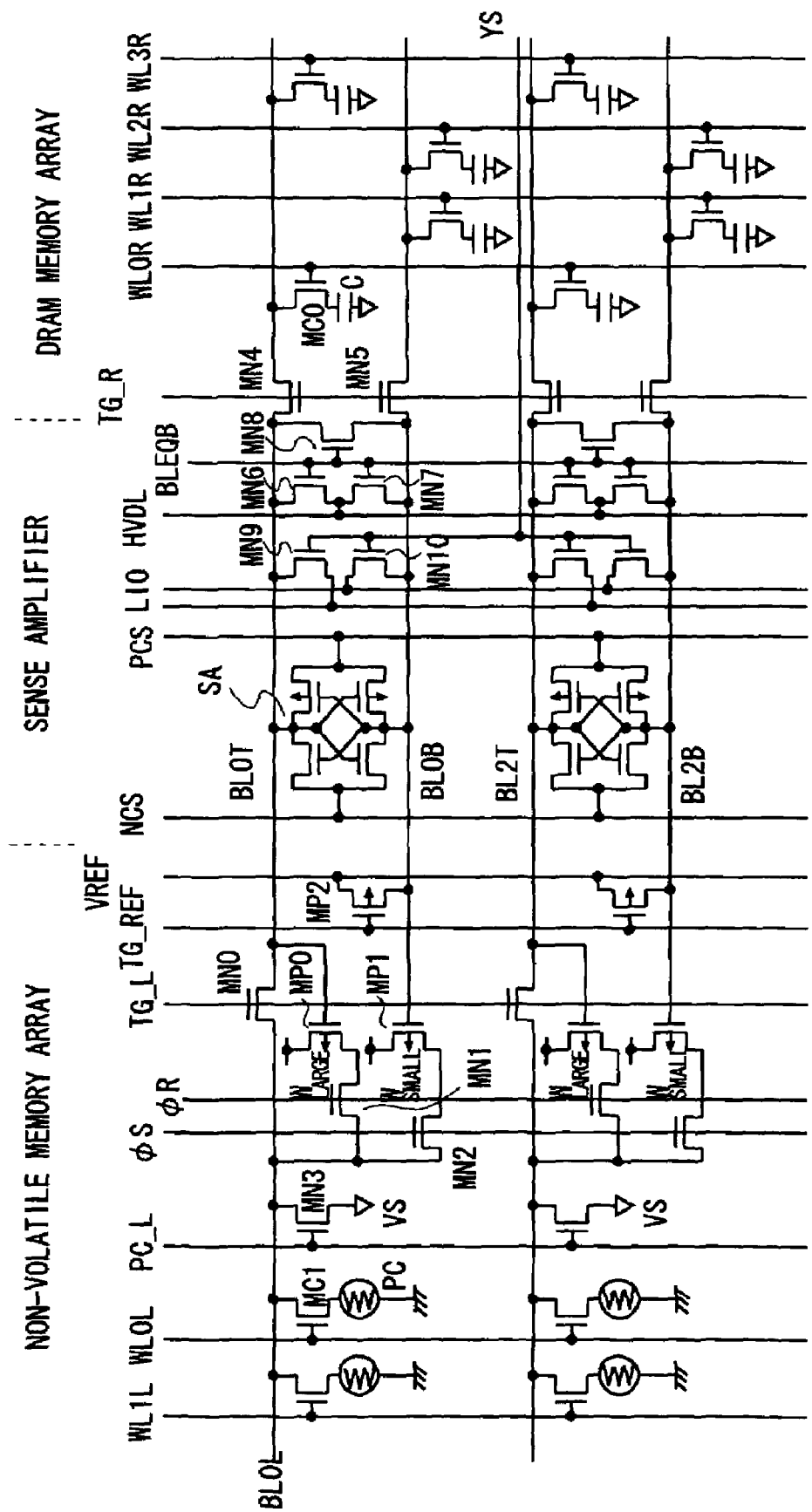
FIG. 3 is a circuit diagram for illustrating the configuration of the embodiment of the present invention.

FIG. 3 shows an illustrative configuration of a sense amplifier, a DRAM memory array and a non-volatile memory array (PCRAM), according to the embodiment of the present invention.

Referring to FIGS. 1 and 3, the non-volatile memory array is arranged in a side-by-side relationship to the DRAM memory array, with the sense amplifiers in-between. It is noted that control signals shown in FIG. 3 are merely for explanation sake and are not intended for limiting the present invention. In FIG. 3, PC_L denotes a bit line precharge signal on the non-volatile memory (PCRAM) side, whilst Φ S and Φ R are signals for controlling set/reset write pulse widths for the phase-change memories. TG_L and TG_R are shared signals (control signals for transfer switches for connecting the bit lines and the shared sense amplifiers SA). TG_REF is a reference potential connection signal, whilst VREF is a reference potential for reading data from the non-volatile memory array (phase change device). NCS and PCS are sense amplifier start signals. LIO denotes an I/O line, whilst BLEQB is a bit line precharge signal. HVDL is a bit line pre-charge potential. YS is a column selection signal output from the column decoder.

WL0R−WL3R denote word lines of the DRAM memory array. Each DRAM memory cell is made up by a MOS transistor (MC0) which has a drain connected to the bit line and a gate connected to the word line, and by a capacitance C which is connected between the source of the MOS transistor and a reference potential, that is set to, for example, one-half the power supply voltage. NMOS transistors MN4 and MN5 compose transfer switches for controlling the on/off between bit lines of the DRAM memory array and the sense amplifiers SA based on the control signal TG_R. NMOS transistors MN6 and MN7, which are connected in series between bit lines BL0T and BL0B, and which have gates connected to the control signal BLEQB, compose a pre-charging circuit for driving the bit line pair to the pre-charging potential HVDL when NMOS transistors MN6 and MN7 are in the on-state. An NMOS transistor MN8, which is connected in series between bit lines of a bit line pair, and which has a gate connected to the control signal BLEQB, composes an equalizer circuit for equalizing the bit line pair. The sense amplifier SA includes two CMOS inverters, each of which is made up of a PMOS transistor and an NMOS transistor which have sources respectively connected to sense amplifier activation signals PCS and NCS providing a high power supply potential and a low power supply potential, respectively. One of the CMOS inverters has an input (gates) cross-coupled to an output (drains) of the other CMOS inverter in a latch configuration. NMOS transistors MN9 and MN10, which are connected to the I/O line LIO and are connected to the bit lines BL0 and BL0B, respectively and which have gates supplied with the column selection signal YS, compose a Y-switch for connecting the selected bit lines to the I/O line. The bit line BL0T of the sense amplifier is connected via transfer switch MN0 to the bit line BL0L of the non-volatile memory array.

WL0L and WL1L are word lines of a non-volatile memory array. A non-volatile memory cell is made up of an NMOS transistor (MC1) and a phase change device (PC). The NMOS transistor (MC1) has a drain connected to the bit line BL0T, a gate connected to the word line, and a source connected to one end of the phase change device. The other end of the phase change device (PC) is connected to the ground. The non-volatile memory array includes a PMOS transistor MP2, which has a source connected to the reference potential VREF, a drain connected to a bit line BL0B, and a gate connected to the control signal TG_REF. The non-volatile memory array also includes a PMOS transistor MP0, which has a drain connected to the power supply and a gate connected to the bit line BL0T, and a PMOS transistor MP1, which has a drain connected to the power supply and a gate connected to the bit line BL0B, an NMOS transistor MN1, which is connected between the drain of the PMOS transistor MP0 and the bit line BL0L and which has a gate connected to the reset signal $\Phi R$, an NMOS transistor MN2, which is connected between the drain of the PMOS transistor MP1 and the bit line BL0L and which has a gate connected to a set signal $\Phi S$, and an NMOS transistor MN3, which has a source connected to VS, a drain connected to the bit line BL0L and a gate connected to the control signal PC_L. The PMOS transistors MP0 and MP1 composes a driver for writing the signal, amplified by the sense amplifier SA, in a non-volatile memory cell. The driving capability of the transistor MP0 is larger (that is, has a relatively larger channel width W), while that of the transistor MP1 is smaller (that is, has a relatively small channel width W). For the next bit line pairs BL0T and BL0B, the sense amplifier and the non-volatile memory array are of a configuration similar to that for the bit line pair BL0T and BL0B.

Before turning the power supply off to enter into the data retention mode, data in the DRAM memory array is transferred to the non-volatile memory area to hold data in the non-volatile memory array. It is noted that data transfer from the DRAM memory array to the non-volatile memory array is carried out in a lump on the word-line basis by combining the transfer mode to the non-volatile memory area with the normal refresh operation.

When data is transferred from the DRAM memory array to the non-volatile memory array, the word line of the non-volatile memory array, corresponding to that of the DRAM memory array, is activated simultaneously. For example, in FIG. 3, the word line WL0L of the DRAM memory array and the word line WL0R of the non-volatile memory array are activated simultaneously. At this time, the transfer switches MN4 and MN5 are turned on, while the transfer switch MN0 is turned off. The sense amplifier SA is connected to the DRAM memory array and is disconnected from the non-volatile memory array. The signal from the memory cell, selected from the word line WL0R of the DRAM memory array, is output to the bit line and amplified by the sense amplifier SA. The signals amplified by the sense amplifier SA, that is, the signals on the bit line pair BL0T and BL0B, a bit line pair BL1T and BL1B, not shown, and the bit line pair BL2T, BL2B, . . . , are written in corresponding memory cells of the non-volatile memory array by write drivers including transistors having gates connected to the bit line pairs. In the case of the bit line pair BL0T and BL0B, these write drivers include PMOS transistors MP0 and MP1.

The write operation is carried out in the following manner. The cells of the non-volatile memory array are devices which hold data by being controlled to be set in two states, namely a reset state or a high resistance state, with the phase change device then being in an amorphous state, and a set state or a low resistance state, with the phase change device then being in a crystalline state. In order for the phase change device to transition between the reset state and the set state, the current needed is caused to flow for a preset time through the phase change device independently to generate heat. In general, it is necessary to cause large current to flow for a short time interval in order to generate the reset state, while it is necessary to cause the current smaller than the current for writing to flow for a longer time interval in order to generate the set state. To this end, the write current and the write time associated with the write data need to be controlled individually for the reset and set states. For realizing this control, the signals on the complementary bit line pairs BL0T and BL0B are used in the present embodiment as driving signals for the driving transistors MP0 and MP1. With the complementary signals on the complementary bit line pairs BL0T and BL0B, only one of the driving transistors MP0 and MP1 is in operation to cause the desired current to flow through the phase change device (PC).

For controlling the write time, the transfer switches MN1 and MN2, which have gates supplied with signals $\Phi R$ and $\Phi S$, respectively, are turned on for a required time duration.

By this configuration, the current needed may be caused to flow for the required time length, depending on the data to be transferred, to the respective memory cells of the non-volatile memory array, even though the data has to be transferred in a lump on the word line basis. That is, data may be transferred in a lump from one word line to another. With this configuration of the present embodiment, there is no necessity to carry out column selecting operations, so that control may be facilitated with advantage. The data may be transferred during the refresh operation by simply controlling the gates of the transistors MN1 and MN2, composing the transfer switches, arranged in the non-volatile memory array.

FIGS. 4A and 4B show illustrative operating waveforms of an embodiment of the present invention. Specifically, FIG. 4A schematically shows the state of data transfer from the DRAM memory array to the non-volatile memory array at the time of transfer from the normal operation to the data retention mode or to the state allowing for disconnection of the power supply. FIG. 4B schematically shows the state of releasing the data retention mode or the manner of data transfer from the non-volatile memory array to the DRAM memory array. Although the following description on the operation is directed to using a clock synchronized DRAM (synchronous DRAM), it is to be noted that the present invention is not limited to this configuration.

In FIG. 4, CLK and CKE denote a clock signal and a clock enable signal, respectively. If CKE is HIGH at the rise time of the previous CLK, the rising edge of the next CLK is valid so that each input signal is sampled. If CKE is LOW at the rise time of the previous CLK, the rising edge of the next CLK is invalid so that no input signal is sampled. A signal Command is a command supplied from outside. A signal Int com is an internal command generated on decoding by a command decoder, not shown. As the waveform for the internal operation, a signal waveform of the refresh operation of the word line WL0 and a signal waveform of the refresh operation of the word line WL255 are schematically shown. PWDN is a power down signal which goes LOW and HIGH when the power supply is turned off and on, respectively.

When CKE goes LOW and when a command for a non-volatile mode is entered, a refresh command REF is generated as an internal command. In transferring data from the DRAM memory array to the non-volatile memory array, the word line of the non-volatile memory array, the data of the DRAM memory array is transferred to, is simultaneously activated and, as in the customary refresh operation, the data from the DRAM cell is amplified by the sense amplifier SA (DRAM read operation). Subsequently, the gate signals ΦR and ΦS of the transfer switches MN1 and MN2 on the non-volatile memory array side, are sequentially set to a HIGH level, for the required time duration, to transfer the data. In this case, the Set/Reset write operation is carried out time-divisionally, that is, Reset transfer and Set transfer are multiplexed time-divisionally. As an alternative, the Set/Reset write operation may be carried out simultaneously. This transfer operation is carried out before entry to the data retention mode as a required number of times of the refresh operations are carried out. In the case of FIG. 4, 256 times of the refresh operations, corresponding to 256 word lines, are carried out.

The refresh command (REF) which is an internal command (Int Com), is issued a required number of times, equal to the number of the word lines of a data transfer area, after the data transfer command (non-volatile mode) is entered, thus completing the transfer operation automatically.

Subsequently, data may be held even if the power supply is turned off, or if the external voltage keeps on to be applied but there is no internal operation, as in so called 'a deep power down mode' for MobileRAM used for a mobile terminal, thereby reducing the current consumption.

During the transfer operation, memory access is inhibited. This time interval of memory access inhibition is of the order of 100 n(nanosecond)×256 approximately equal to 25 us(microsecond).

As shown in FIG. 4B, when data is to be read, by way of restoration from the data retention mode, the power supply is turned on and refresh operations are carried out a number of times required, whereby data is automatically re-transferred to the DRAM memory cell array. This may be achieved on detection of power up or on executing a transfer start command. In this case, data is transferred in a lump on the word line basis. The data read from the selected cell of the non-volatile memory array to the bit line BL0L is amplified by the sense amplifier SA via the transfer switch MN0 in the on-state. The sense amplifier SA is connected at this time to the non-volatile memory array and is disconnected from the DRAM memory array by turning the switches MN4 and MN5 off. In a stand-by state, ΦTP (TG_L) is HIGH to turn the transfer switch MN0 on. The bit line BL0T, connected to the phase change memory cell, is pre-charged to the potential VS by the pre-charging MOS transistor MN3. The complementary bit line BL0B is pre-charged to the reference potential VREF. The potential VS is set to a value slightly higher than the reference potential VREF.

It is assumed that a word line, for example, WL0L, has been activated. In case the memory cell, selected by a word line of the non-volatile memory array, is in the Set state (low resistance state), the current flows to VS via phase change device, thereby lowering the potential. In case the latch type sense amplifier SA is started after a certain time, the differential potential is differentially amplified, with the bit line BL0T then being at a low level.

In case the memory cell, selected by a word line of the non-volatile memory array, is in the Reset state (high resistance state), the pre-charge potential VS is scarcely varied, and hence the bit line BL0T becomes HIGH.

After the completion of amplification by the sense amplifier SA, the transfer switches MN4 and MN5 on the DRAM memory array side are turned on to transfer data to the memory cell as selected by the word line on the DRAM memory array side, by way of writing the data.

This operation is repeated a number of times corresponding to the number of the word lines of the non-volatile memory array to complete the transfer operation so that all data are stored in the memory cells of the DRAM memory array.

This completion of the transfer operation may be monitored by an internal refresh counter or by a dedicated counter to detect that all of the data in the non-volatile memory array has been transferred, thereby terminating the transfer operation automatically.

Subsequently, only cells of the DRAM memory array are accessed to enable high-speed Read/Write operations.

With the above-described constitution and operations, it is possible to implement a high-speed non-volatile memory.

With the above-described configuration of the present invention, in which the DRAM, capable of a high-speed read (Read)/write (Write) operations, and the non-volatile memory, are mounted on one chip, and data is transferred between the two memories before and after the data retention mode, the chip operates as a high-speed DRAM during the usual Read/Write operations, while operating as a non-volatile memory during the data holding time. Hence, there may be provided a semiconductor memory which takes advantage of the merits of both memory types.

In the above embodiment, memory access is inhibited after the end of the data retention mode until the transfer operation has come to a close. However, in case the non-volatile memory array is comprised of a phase change memory (PCRAM), read may be made at a speed equivalent to the read speed of the DRAM. Hence, data may directly be read from the PCRAM even before carrying out the transfer operation.

In this case, the read operation may be carried out before completion of the transfer (the number of times of refresh operations equal to the number of word lines connected to the memory cells lying in an area for transfer to the PCRAM). However, if the write operation to the area is executed, there is brought about inconsistency in data between the area of the DRAM memory array and the non-volatile memory array, and hence the write operation is inhibited.

In the above-described embodiment, data is transferred to the non-volatile memory array before entering into the data retention mode, and is transferred between the DRAM memory array and the non-volatile memory array when exiting from the holding mode. As for the transfer method, the following transfer method may be used.

A phase change memory (PCRAM) has such a features that it has a read speed equivalent to that of the DRAM but has a write speed about ten times slower, with the upper limit of the number of times of rewrite operations being on the order of $10^{12}$ which is lower by about four orders of magnitude than the 10-year guarantee value of $10^{16}$ of the DRAM. The number of times of rewrite operations is lower than that of the DRAM/SRAM, however, is by about four orders of magnitude. That is, 10-year guarantee is possible if the write operation is carried out at a rate slower by four orders of magnitude.

Since the refresh cycle of the typical DRAM is 64 ms, it is slower by about six orders of magnitude than the write time.

If the transfer from the DRAM memory array to the non-volatile memory array is executed during the refresh operation, the value of the number of rewrite operations of the 10-year guarantee which is smaller by six order of magnitudes suffices. Hence, even with the number of times of $10^{12}$, the sufficient guarantee for the number of times of the rewrite operations may be provided, thus eliminating the problem of the small number of the rewrite operations.

Moreover, since the transfer may be made during the normal refresh operations, there is no necessity of providing the data retention mode.

In addition, if no writing is done during one complete turn of the refresh period, the refresh operation may be done only on the DRAM memory array side and the transfer operation may be dispensed with to reduce further the number of rewrite operations as well as the current consumption.

The user is able to use the memory apparatus as a high-speed non-volatile memory if only he/she executes refresh operations a required number of times before and after turning on the power supply.

In the above-described embodiment, the data is transferred in a lump, on the word line basis, through the sense amplifiers. In this case, the area of possible transfer to the non-volatile memory array is determined physically.

If desired to save data of a particular address space in a non-volatile memory array, it is necessary to store needed data in advance in a particular address space, such that it is necessary to determine the area at least in the initializing stage.

In a modification of the present invention, the user is able to transfer data of an arbitrary space to the non-volatile memory array.

In the present embodiment, an optional space is specified by writing the addressing of mats in the DRAM memory array to be transferred to an area of the non-volatile memory array in a mode register.

In this case, addresses are scrambled so that data specified by the address will be transferred to the area in the non-volatile memory array. This embodiment is shown in FIGS. 5A and 5B. FIG. 5A shows an example of allocation in an initial state, that is, the relationship of correspondence between mat numbers and addresses X0, X1 and X2.

FIG. 5B shows FIG. 5A in a tabulated form. (X0, X1, X2)=(0, 0, 0) specifies the mat No. 0 and (X0, X1, X2)=(1, 1, 1) specifies the mat No. 7.

Referring to FIG. 5A, the mat No. 0 may be transferred to the non-volatile memory array. That is, in an initial state, the area that can be transferred is the memory mat No. 0, with an address being (0, 0, 0).

If, starting from the initial state of FIG. 5A, data of the mat No. 5, with the address (X0, X1, X2)=(1, 0, 1), in the DRAM memory array (volatile area), is desired to be held, by the mode register, not shown, X0 and X2 are inverted, in accordance with setting in the register, not shown, and the resulting address is entered to the address decoder.

The physical areas of the mat No. 0 and the mat No. 5 are interchanged, such that it becomes possible to transfer data stored in the mat No. 5 to an area of the non-volatile memory array, as shown in FIG. 5C. The address (X0, X1, X2)=(1, 0, 1) has X0 and X2 complemented, so that the mat No. 5 is accessed. The mat No. 5 is in an area of the mat No. 0. The mat Nos. 4, 7, 6, 1, 0, 3, and 2 are in the areas of the mat Nos. 1, 2, 3, 4, 5, 6, and 7, respectively.

The technique described above is effective in case the addresses of data to be retained after power down are known. However, the technique is not effective in case the addresses of data to be retained after power down are not determined at the time of initialization.

In a further embodiment of the present invention, it is possible to specify the area of the data desired to be transferred to the corresponding area of the non-volatile memory array. FIG. 6 is a diagram for illustrating this further embodiment of the present invention.

The information of the mat, the data of which is to be transferred to the non-volatile memory array (PCRAM), is set in a mode register, not shown. Referring to FIG. 6B, if a memory mat which is not the area neighboring to the non-volatile memory array has been selected, data is transferred to the sense amplifier connecting to the non-volatile memory array via an I/O line, as shown in FIG. 6B. It is noted that a column switch, read by the sense amplifier, is turned on to interconnect the bit line and the I/O line).

When data corresponding to one word line of the DRAM mat has been transferred, the DRAM data is written in a lump in the non-volatile memory array in accordance with the transfer method described above. This sequence of operations is carried out until all mat data has been transferred. When this sequence of operations has come to a close, the transfer is completed automatically.

After completion of the transfer, the information for address scrambling is written in a register (non-volatile register). The addresses are changed so that the physical address will be adjacent to the area of the non-volatile memory array. The logical addresses are not changed. In this manner, the back transfer operation may be executed so that data may be transferred to the neighboring mat area in a lump on the word line basis, thereby shortening the transfer time.

Although the present invention has so far been explained with reference to the preferred embodiments, the present invention is not limited to the particular configurations of these embodiments. It will be appreciated that the present invention may encompass various changes or corrections such as may readily be arrived at by those skilled in the art within the scope and the principle of the invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor storage apparatus comprising:
   a first memory array consisting of a plurality of volatile memory cells;
   a second memory array consisting of a plurality of non-volatile memory cells; and
   a sense amplifier provided between said first and second memory arrays;
   wherein a data transfer from each of said first memory array and said second memory array to the other memory array is carried out through said sense amplifier.

2. The semiconductor storage apparatus according to claim 1 wherein said volatile memory cells comprise dynamic memory cells in need of refresh for data retention.

3. The semiconductor storage apparatus according to claim 1 wherein said sense amplifier is shared between said first and second memory arrays.

4. The semiconductor storage apparatus according to claim 1 wherein said non-volatile memory cells comprise phase change memory cells capable of assuming a set state with low resistance and a reset state with high resistance.

5. The semiconductor storage apparatus according to claim 1 wherein, prior to entry to a data retention mode or power down, at least a portion of data of said first memory cell array is transferred to said second memory array, and after the end of transfer, said data is held by said non-volatile memory cells of said second memory array.

6. The semiconductor storage apparatus according to claim 5 wherein, after exiting said data retention mode or power up, the data held by the non-volatile memory cells of said second memory array are returned to the volatile memory cells of said first memory array and access is made to said first memory array.

7. The semiconductor storage apparatus according to claim 1 wherein access is directly made to said second memory array from outside.

8. The semiconductor storage apparatus according to claim 7 wherein, during transfer of data from said first memory array to said second memory array, read access to said second memory array is allowed, while write access is inhibited.

9. The semiconductor storage apparatus according to claim 1 wherein data transfer from said first memory array to said second memory array is done through said sense amplifier on the word line basis.

10. The semiconductor storage apparatus according to claim 1 wherein data transfer from said first memory array to said second memory array is done at the time of refresh of said first memory array.

11. The semiconductor storage apparatus according to claim 10 wherein data from a memory cell of a word line selected by a refresh address is via a bit line, amplified by said sense amplifier and is written in the memory cell of the corresponding word line of said second memory array.

12. The semiconductor storage apparatus according to claim 11 further comprising:
a first switch for on/off controlling a connection between a bit line of said first memory array and said sense amplifier; and
a second switch for on/off controlling a connection between a bit line of said second memory array and said sense amplifier;
wherein data of a memory cell is selected by the word line of said first memory array, as said first switch is turned on, said second switch is turned off, and the data selected by a word line of said first memory array is via a bit line amplified by said sense amplifier; and
wherein the signal amplified by said sense amplifier is written in a memory cell selected by a word line of said second memory array as said first switch is turned off and said second switch is turned on.

13. The semiconductor storage apparatus according to claim 12 wherein data of a memory cell selected by a word line of said second memory array as said first switch is turned off and said second switch is turned on, is amplified by said sense amplifier; and
wherein the signal amplified by said sense amplifier is written in a memory cell selected by a word line of said first memory array as said second switch is turned on and said first switch is turned on.

14. The semiconductor storage apparatus according to claim 12 further comprising
means for selecting a writing to a set state or to a reset state in a phase change memory cell, forming a memory cell of said second memory array, depending on said signal amplified by said sense amplifier.

15. The semiconductor storage apparatus according to claim 14 further comprising:
a first write driver and a second write driver for receiving signals on a bit line pair differentially amplified by said sense amplifier and for driving a bit line of said second memory array; and
first and a second transfer switches having one ends connected in common to a bit line of said second memory array and having opposite ends connected to outputs of said first and second write drivers, respectively;
wherein reset/set write pulse signals are supplied to control terminals of said first and a second transfer switches.

16. The semiconductor storage apparatus according to claim 15 wherein the write pulse signal provides a timing signal on a word line basis; and
wherein a reset state and a set state are written time-divisionally or simultaneously.

17. The semiconductor storage apparatus according to claim 14 wherein the bit line of said second memory array is connected to one of bit lines of a bit line pair of a sense amplifier side via said second switch; said apparatus comprising:
a circuit turned on by a pre-charge control signal to pre-charge a bit line of said second memory array; and
a circuit turned on by a control signal to set the other bit line of said bit line pair of said sense amplifier side to a preset reference potential.

18. The semiconductor storage apparatus according to claim 1 wherein there are provided a plurality of said first memory arrays each including a plurality of volatile memories; and
wherein said first memory array from which data is transferred to said second memory is specified and data of specified volatile memory cells of the first memory array are transferred to said second memory array.

19. The semiconductor storage apparatus according to claim 18 further comprising means for converting and decoding an address which specifies said first memory array; and
wherein the first memory array specified becomes an array of an area facing said second memory array with said sense amplifier in-between.

20. The semiconductor storage apparatus according to claim 1 further comprising:
another one of the first memory array provided in an area different from an area neighboring said sense amplifier facing said second memory array, wherein data of said first memory array is transferred over an input/output line to said sense amplifier facing said second memory array; and
wherein data of said first memory array is transferred over an input/output line to said sense amplifier facing said second memory array and transferred therefrom to the non-volatile memory cell of said second memory cell.

* * * * *